(12) United States Patent
Lim et al.

(10) Patent No.: US 11,929,260 B2
(45) Date of Patent: Mar. 12, 2024

(54) LOW WARPAGE CURING METHODOLOGY BY INDUCING CURVATURE

(71) Applicant: Applied Materials, Inc., Santa Clara, CA (US)

(72) Inventors: Fang Jie Lim, Singapore (SG); Chin Wei Tan, Singapore (SG); Jun-Liang Su, Singapore (SG); Felix Deng, Singapore (SG); Sai Kumar Kodumuri, Singapore (SG); Ananthkrishna Jupudi, Singapore (SG); Nuno Yen-Chu Chen, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 155 days.

(21) Appl. No.: 17/410,958

(22) Filed: Aug. 24, 2021

(65) Prior Publication Data
US 2023/0061379 A1 Mar. 2, 2023

(51) Int. Cl.
*H01L 21/56* (2006.01)
*H01L 21/67* (2006.01)
(Continued)

(52) U.S. Cl.
CPC ............ *H01L 21/56* (2013.01); *H01L 21/563* (2013.01); *H01L 21/67109* (2013.01); *H01L 21/67115* (2013.01); *H01L 24/75* (2013.01); *H01L 24/83* (2013.01); *H01L 21/6838* (2013.01); *H01L 24/73* (2013.01); *H01L 25/0655* (2013.01); *H01L 2224/73204* (2013.01); *H01L 2224/75272* (2013.01); *H01L 2224/7555* (2013.01); *H01L 2224/75744* (2013.01);
(Continued)

(58) Field of Classification Search
CPC . H01L 21/67126; H01L 21/56; H01L 21/568; H01L 2924/3511
See application file for complete search history.

(56) References Cited

U.S. PATENT DOCUMENTS 6,387,728 B1  5/2002 Pai et al.
7,387,945 B2  6/2008 Hara
(Continued)

FOREIGN PATENT DOCUMENTS

CN   109849278 A  *  6/2019
CN   217468394 U  *  9/2022
(Continued)

OTHER PUBLICATIONS

PCT International Search Report and Written Opinion for PCT/US2022/040991 dated Dec. 7, 2022.
U.S. Appl. No. 17/410,958, filed Aug. 24, 2021.

*Primary Examiner* — David A Zarneke
(74) *Attorney, Agent, or Firm* — MOSER TABOADA (57) ABSTRACT

Embodiments of methods and apparatus for reducing warpage of a substrate are provided herein. In some embodiments, a method for reducing warpage of a substrate includes: applying an epoxy mold over a plurality of dies on the substrate in a dispenser tool; placing the substrate on a pedestal in a curing chamber, wherein the substrate has an expected post-cure deflection in a first direction; inducing a curvature on the substrate in a direction opposite the first direction; and curing the substrate by heating the substrate in the curing chamber.

20 Claims, 5 Drawing Sheets

(51) Int. Cl.
*H01L 21/683* (2006.01)
*H01L 23/00* (2006.01)
*H01L 25/065* (2023.01)

(52) U.S. Cl.
CPC ............... *H01L 2224/75985* (2013.01); *H01L 2224/75986* (2013.01); *H01L 2224/83047* (2013.01); *H01L 2224/83048* (2013.01); *H01L 2224/8322* (2013.01); *H01L 2224/8385* (2013.01); *H01L 2224/83908* (2013.01); *H01L 2924/20104* (2013.01); *H01L 2924/20105* (2013.01); *H01L 2924/3511* (2013.01)

(56) References Cited

U.S. PATENT DOCUMENTS

| | | |
|---|---|---|
| 9,831,190 B2 | 11/2017 | Yew et al. |
| 10,290,569 B2 * | 5/2019 | Yazzie ............... H01L 23/3675 |
| 2005/0161818 A1 | 7/2005 | Basceri |
| 2006/0126050 A1 | 6/2006 | Momose |
| 2007/0049020 A1 | 3/2007 | Huang et al. |
| 2007/0063324 A1 | 3/2007 | Mishiro et al. |
| 2013/0309621 A1 | 11/2013 | Huang et al. |
| 2020/0131624 A1 | 4/2020 | Lianto et al. |
| 2021/0035795 A1 | 2/2021 | Peng et al. |

FOREIGN PATENT DOCUMENTS

| | | | | |
|---|---|---|---|---|
| DE | 10126508 | * | 5/2001 | |
| JP | 05160176 A | * | 6/1993 | |
| JP | 10326800 A | * | 12/1998 | |
| KR | 10-2001-0076522 A | | 8/2001 | |
| WO | WO-2010104001 A1 | * | 9/2010 | ............. H01L 21/56 |

* cited by examiner

LOW WARPAGE CURING METHODOLOGY BY INDUCING CURVATURE

FIELD

Embodiments of the present disclosure generally relate to substrate processing equipment.

BACKGROUND

Warped substrates prevent the substrates from being chucked fully on a process station pedestal. Such warpage leads to a delay in or ceasing of the substrate processing. For example, a substrate may comprise multiple dies on an interposer and encapsulated with an epoxy mold compound or a substrate may comprise multiple exposed dies. These substrates may bow and warp after thermal processes due to inhomogeneous heating and cooling, causing non-uniform expansion/contraction rates in current process equipment.

Conventional thermal processes utilize directional heat transfer that results in anisotropic expansion and contraction rates. When operated near the thermoplastic regime, non-uniform cooling and, subsequently, contraction rates give rise to a warped substrate. Such warp and bow effects are frequently observed and imply that the substrate is being processed close to the thermoplastic regime of the substrate, giving rise to substrate warpage beyond acceptable levels. Being able to reduce warpage found in substrates would increase production yields.

Accordingly, the inventors have provided improved methods and apparatus for reducing warpage found in substrates.

SUMMARY

Embodiments of methods and apparatus for reducing warpage of a substrate are provided herein. In some embodiments, a method for reducing warpage of a substrate includes: applying an epoxy mold over a plurality of dies on the substrate in a dispenser tool; placing the substrate on a pedestal in a curing chamber, wherein the substrate has an expected post-cure deflection in a first direction; inducing a curvature on the substrate in a direction opposite the first direction; and curing the substrate by heating the substrate in the curing chamber.

In some embodiments, a method for reducing warpage of a substrate includes: applying an epoxy mold over a plurality of dies on the substrate in a dispenser tool; placing the substrate on a pedestal in a curing chamber, wherein the substrate has an expected post-cure deflection in a first direction; inducing a curvature on the substrate so that a central region of the substrate is elevated about 1 to about 3 mm with respect to an outer edge of the substrate; and curing the substrate by heating the substrate in the curing chamber.

In some embodiments, a curing chamber for reducing warpage of a substrate with an epoxy layer includes: a chamber body having an interior volume; a pedestal that is transferable and that holds the substrate disposed in the interior volume, wherein the pedestal is configured to induce a curvature on the substrate; a ring disposed along an outer periphery of the pedestal and configured to curve an outer edge of the substrate towards the pedestal; and a heat source configured to heat the substrate to a temperature of about 100 to about 200 degrees Celsius.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for reducing warpage of a substrate are provided herein. The substrate has an expected post-cure deflection in a first direction. The substrate is curved in a direction opposite the first direction prior to curing, so that post-cure, the substrate has reduced warpage. For example, when a substrate has warpage greater than 2 mm, the substrate is generally deemed unusable. Even backgrinding processes require less than 2 mm in warpage in order to be utilized. In semiconductor back end of the line (BEOL) packaging, 2.5D is a methodology for including multiple dies inside the same package. The 2.5D approach is used for applications where performance and low power are critical. In a 2.5D wafer, communication between chips is established using either a silicon or organic interposer, typically a chip or layer with through-silicon vias (TSV) for communication. 2.5D architectures have been paired with stacked memory modules, such as High-Bandwidth Memory (HBM), to further improve performance. High warpage of 2.5D wafers is a pressing industrial problem as the warpage prevents the 2.5D wafers from flowing on to downstream processes.

Wafer handling challenges and reduction in yield are the most common detrimental effects of high 2.5D wafer warpage. The methods and apparatus of the present principles may be applied to advantageously correct warpage of a 2.5D wafer which is fully encapsulated with epoxy mold compound, which has exposed dies, or to correct warpage of any multilayer substrates. The methods and apparatus reduce warpage by prestressing, or inducing a curvature, on the substrate, prior to curing the substrate, saving time and possible damage to delicate circuits, especially those sensitive to thermal budgets and smaller structures that are more easily damaged by thermal changes.

Figure 1:
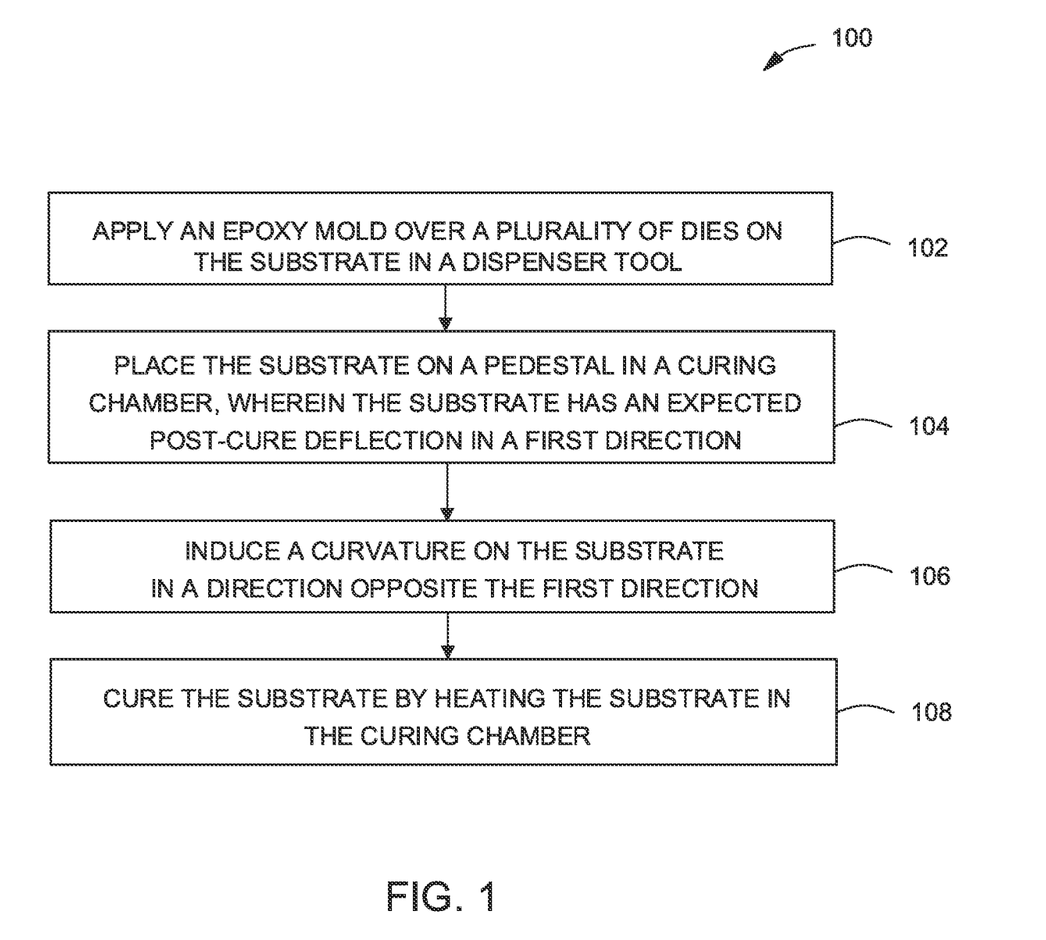
FIG. 1 depicts a flow diagram of a method of reducing warpage of a substrate in accordance with at least some embodiments of the present disclosure.
Figure 2A:
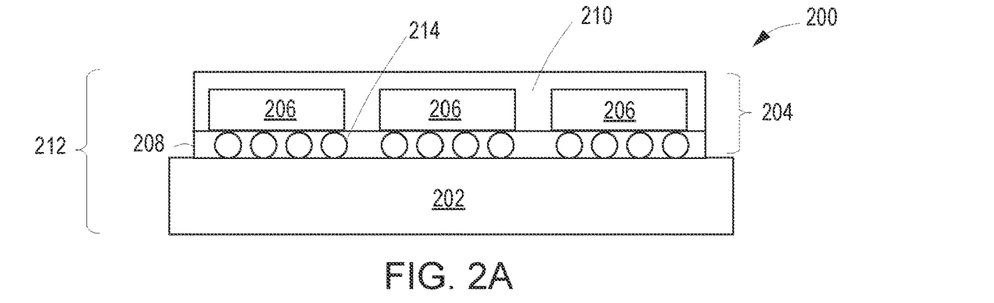
FIG. 2A depicts a cross-sectional view of a substrate that may be processed in accordance with at least some embodiments of the present disclosure.
Figure 2B:
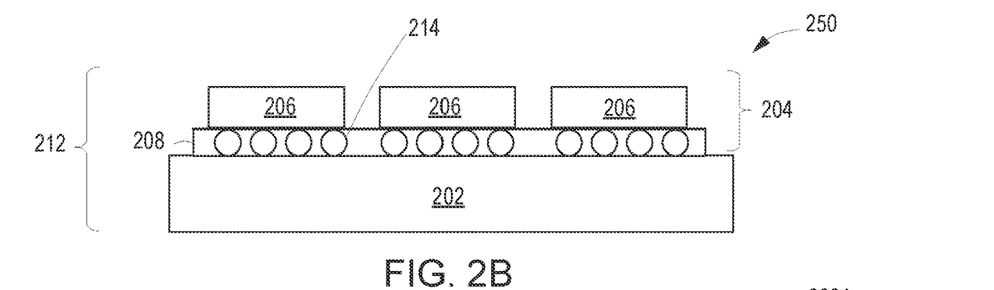
FIG. 2B depicts a cross-sectional view of a substrate that may be processed in accordance with at least some embodiments of the present disclosure.

FIG. 1 depicts a flow diagram of a method 100 of reducing warpage of a substrate in accordance with at least some embodiments of the present disclosure. The method 100 at 102 includes applying an epoxy mold (e.g., epoxy mold under fill layer 208 or epoxy mold 210) over a plurality of dies on a substrate (e.g., substrate 212) in a dispenser tool. For example, the substrate 212 may be substrate 200 as depicted in FIG. 2A or substrate 250 as depicted in FIG. 2B. FIG. 2A depicts a cross-sectional view of the substrate 200 that may be processed in accordance with at least some embodiments of the present disclosure. FIG. 2B depicts a cross-sectional view of the substrate 250 that may be processed in accordance with at least some embodiments of the present disclosure.

In some embodiments, the substrate 212 may include an interposer layer 202. In some embodiments, as shown in FIG. 2A, the substrate 200 includes an epoxy mold encapsulation layer 204. The epoxy mold encapsulation layer 204 may include epoxy mold 210, a plurality of dies 206 embedded in the epoxy mold 210, and an epoxy mold under fill layer 208. The epoxy mold under fill layer 208 may also include solder bumps 214. In some embodiments, as shown in FIG. 2B, the epoxy mold encapsulation layer 204 does not include the epoxy mold 210 such that dies 206 disposed on the epoxy mold under fill layer 208 are exposed.

Figure 3:
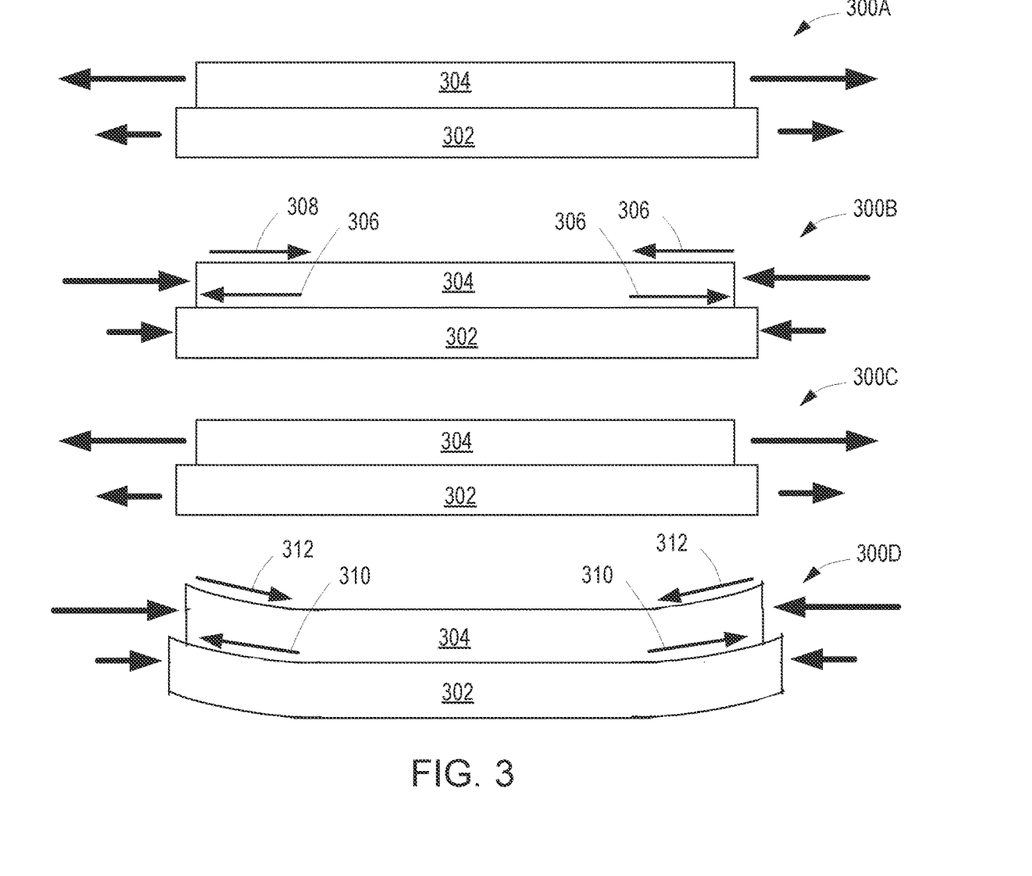
FIG. 3 depicts an illustration of forces applied to a substrate during heating and cooling which may be circumvented in accordance with some embodiments of the present principles.

At 104, the method 100 includes placing the substrate on a pedestal (e.g., pedestal 410, 610) in a curing chamber (e.g. curing chamber 400). The substrate has an expected post-cure deflection in a first direction. The deflection in the first direction is caused by different coefficient of thermal expansion (CTE) of the different layers of the substrate. In some embodiments, the first direction is upwards away from the pedestal. For example, FIG. 3 is an illustration of forces applied to a substrate during heating and cooling in accordance with some embodiments. FIG. 3 depicts an illustration of forces applied to a substrate during heating and cooling which may be circumvented in accordance with some embodiments of the present principles. In view 300A, the substrate is being heated. An interposer layer 302 expands during heating but with a coefficient of thermal expansion (CTE) of less than half the CTE of an epoxy mold encapsulation layer 304.

In view 300B, the substrate is being cooled causing thermal contraction. Because of the differences in CTE, the epoxy mold encapsulation layer 304 contracts more than the interposer layer 302. Tensile stress forces 306 result at the union of the epoxy mold encapsulation layer 304 and the interposer layer 302 because of the differences in CTE. The differences in CTE also cause compressive stress forces 308 to form at an upper portion of the epoxy mold encapsulation layer 304.

In view 300C, the substrate is cured causing differences in thermal expansion and shrinkage of the epoxy material in the epoxy mold encapsulation layer 304 along with polymerization. The curing establishes the mechanical properties of E.M.C. (Elastic Modulus, CTE $\alpha 1$ and CTE $\alpha 2$). In view 300D, thermal contraction occurs with different forces on each layer when the substrate is cooled after curing. The cured epoxy contraction in the epoxy mold encapsulation layer 304 is restricted by the silicon in the interposer layer 302 during post cure cooling. A higher elasticity modulus of the epoxy material exerts higher stress forces on the silicon. High tensile stress forces 310 form at the bonding interface between the epoxy mold encapsulation layer 304 and the interposer layer 302. High compressive stress forces 312 form at an upper portion of the epoxy mold encapsulation layer 304 which causes both layers to warp after post cure cooling.

At 106, the method 100 includes inducing a curvature on the substrate in a direction opposite the first direction. Inducing the curvature on the substrate comprises curving an outer edge of the substrate with respect to a central region of the substrate. In some embodiments, inducing the curvature on the substrate comprises elevating a central region of the substrate about 1 to about 3 mm with respect to the outer edge of the substrate. The inventors have observed that curving the substrate about 1 to about 3 mm advantageously corrects for warpage while preventing the substrate from cracking or breaking. In some embodiments, inducing the curvature includes placing the substrate on a pedestal having a central region raised with respect to a peripheral region of the pedestal and applying a force against the substrate to conform the substrate to the pedestal. For example, in some embodiments, applying the force comprises placing a ring (e.g., ring 406) that is weighted on the peripheral region of the substrate to curve the substrate.

Figure 5A:
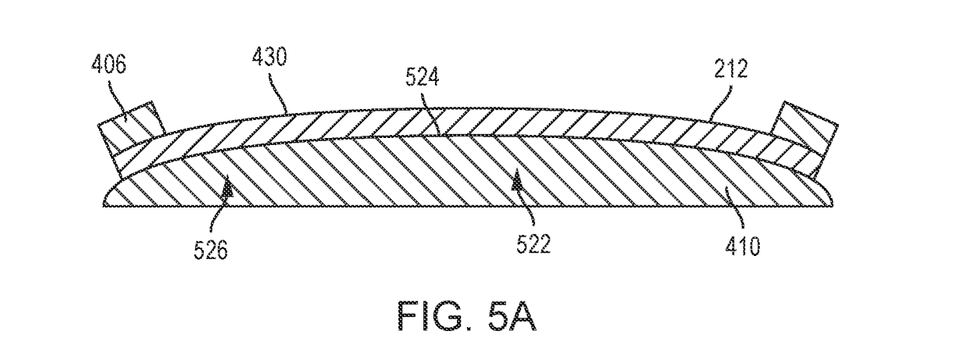
FIG. 5A depicts a schematic cross-sectional view of a pedestal with a ring disposed on the pedestal in accordance with at least some embodiments of the present disclosure.
Figure 5B:
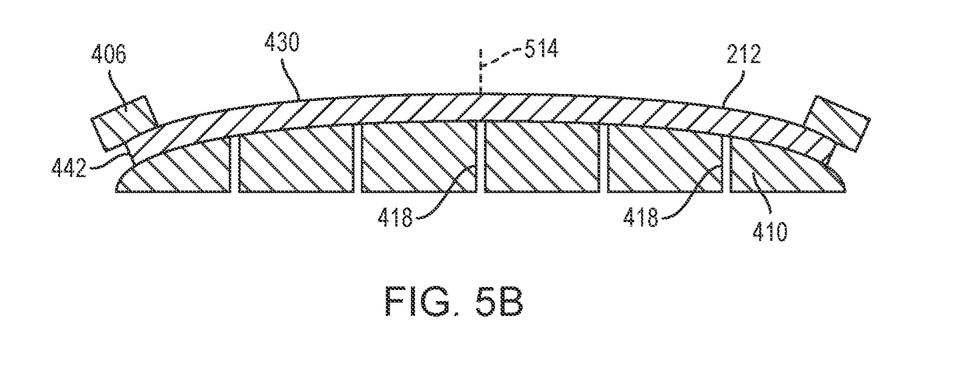
FIG. 5B depicts a schematic cross-sectional view of a pedestal with a ring disposed on the pedestal in accordance with at least some embodiments of the present disclosure.

In some embodiments, inducing the curvature on the substrate comprises placing the substrate on the pedestal that is curved in a suitable manner. For example, FIG. 5A and FIG. 5B depict schematic cross-sectional views of a pedestal with a ring disposed on the pedestal in accordance with at least some embodiments of the present disclosure. In some embodiments, as shown in FIG. 5A, the pedestal 410 has an upper surface 430 that is curved. The pedestal includes a central portion 522 and a peripheral portion 526. In some embodiments, the upper surface 430 includes a flat portion 524 at the central portion 522 of the pedestal 410. In some embodiments, the upper surface 430 at the peripheral portion 526 curves downward from the flat portion 524 towards an outer edge of the upper surface 430. In some embodiments, as shown in FIG. 5B, the upper surface 430 curves downward continuously from a central axis 514 of the pedestal 410 to the peripheral portion 526, or to the outer edge of the pedestal 410. In some embodiments, the ring 406 is disposed on a peripheral region of the substrate 212 to provide substantially equal distribution of force around an outer edge of the substrate 212. In some embodiments, the ring 406 is disposed on an outer about 1 to about 3 mm of the substrate 212.

Figure 6:
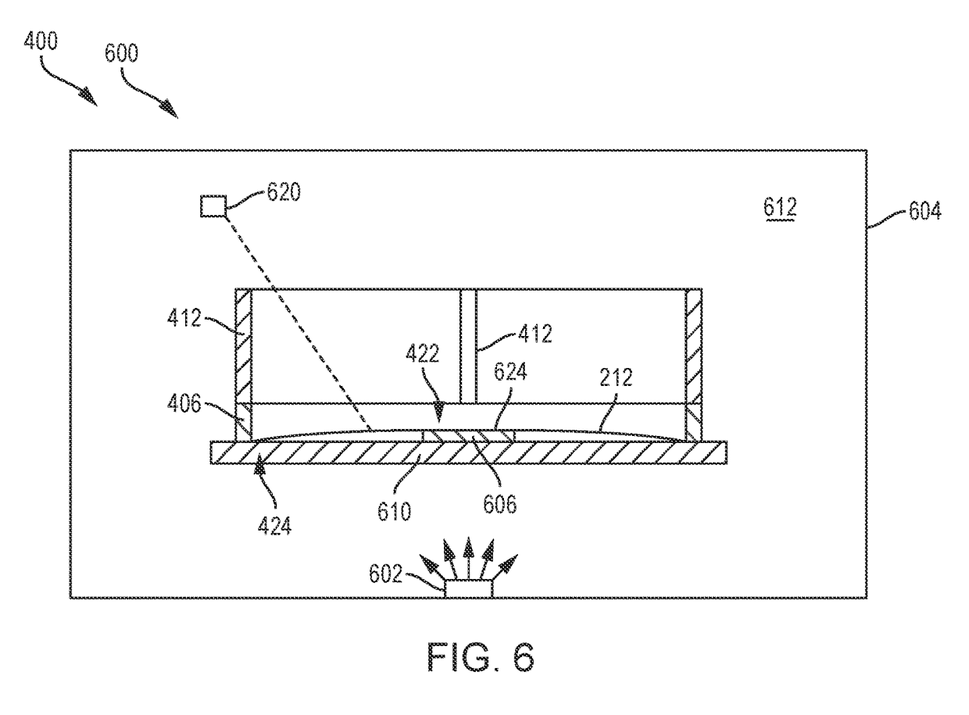
FIG. 6 depicts a schematic side view of a curing chamber in accordance with at least some embodiments of the present disclosure.

In some embodiments, the pedestal 410 includes vacuum channels 418 or vacuum grooves to facilitate vacuum chucking of the substrate 212 to the pedestal 410 to aid in inducing curvature. In some embodiments, the curvature on the substrate is induced by the vacuum chucking and not by the ring 406. In some embodiments, inducing the curvature on the substrate comprises placing a center plate (e.g., center plate 606) on the pedestal (e.g., pedestal 610), placing the substrate on the center plate, and placing the ring along the outer edge of the substrate to curve the outer edge towards the pedestal, as depicted in FIG. 6.

Referring back to FIG. 1, at 108, the method includes curing the substrate by heating the substrate in the curing chamber. In some embodiments, heating the substrate in the curing chamber is performed for a duration of about 1 to about 2 hours. In some embodiments, curing the substrate comprises: pre-curing the substrate in a pre-cure chamber (e.g., pre-cure chamber 402) by placing the pedestal and the substrate on a heater plate (e.g., heater plate 408).

Figure 4A:
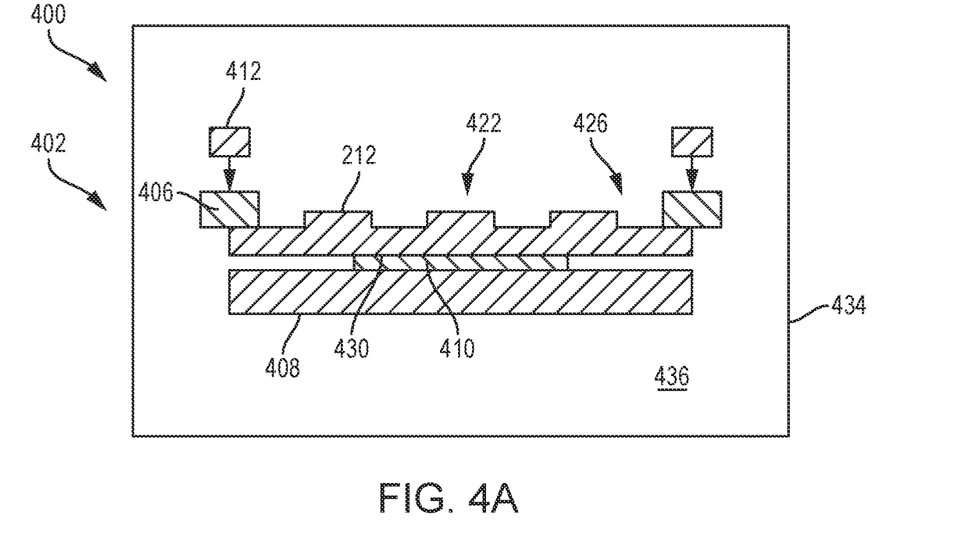
FIG. 4A depicts a schematic side view of a pre-cure chamber in accordance with at least some embodiments of the present disclosure.

FIG. 4A depicts a schematic side view of a pre-cure chamber 402 in accordance with at least some embodiments of the present disclosure. The pre-cure chamber 402 generally includes a chamber body 434 and an interior volume 436. The pedestal 410 for supporting the substrate 212 is disposed in the interior volume 436. In some embodiments, the ring 406 that is weighted is disposed on a peripheral region 426 of the substrate 212 to curve the substrate 212. In some embodiments, the peripheral region 426 of the substrate 212 is a portion of the substrate 212 that does not include the plurality of dies so that the ring 406 does not damage any of the dies on a central region 422 of the substrate. The ring 406 may be weighted based on the force required to compensate for expected warpage of the substrate 212 post-cure or type of substrate.

In some embodiments, one or more weights 412 may be disposed on the ring 406 to provide additional force. The one or more weights 412 may be any geometry. For example, the one or more weights 412 comprise one or more rings, one or more posts, or the like. In some embodiments, the pedestal 410 may be made of a conductive material, for example, a metal such as aluminum. In some embodiments, the ring 406 may be made of a metal such as aluminum. In the pre-cure chamber 402, the pedestal 410 is disposed on a heater plate 408 configured to pre-cure the substrate 212. Pre-curing the substrate 212 generally comprises heating the substrate 212 to a temperature that facilitates the epoxy material of the substrate 212 to flow but where cross-links between polymer chains of the epoxy material are not fully formed. In some embodiments, during pre-curing, the substrate is heated to about 105 to about 125 degrees Celsius. In some embodiments, the substrate 212 is pre-cured for a duration of about 5 to about 15 minutes.

Figure 4B:
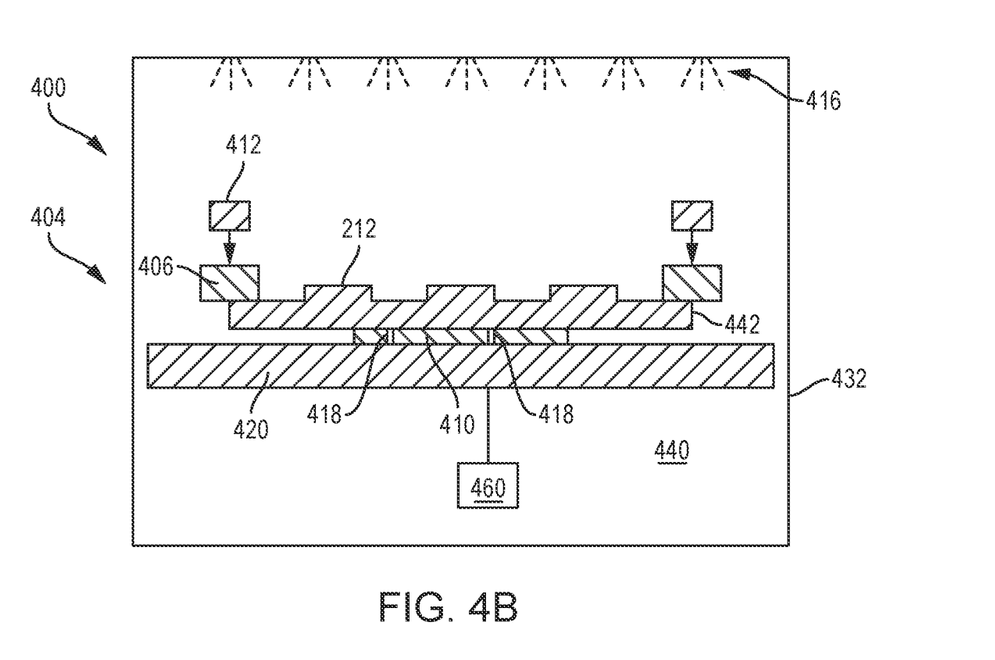
FIG. 4B depicts a schematic side view of a curing chamber in accordance with at least some embodiments of the present disclosure.

In some embodiments, curing the substrate comprises subsequently moving the pedestal and the substrate to a furnace (e.g. curing chamber 404) after the precure chamber and heating the substrate in the furnace. In some embodiments, during curing, the furnace is heated to a temperature of about 165 to about 190 degrees Celsius. In some embodiments, the substrate is heated in the furnace for a duration of about 1 to 2 hours to cure the substrate. FIG. 4B depicts a schematic side view of a curing chamber 404, or furnace, in accordance with at least some embodiments of the present disclosure.

In some embodiments, the pedestal 410, the substrate 212, and the ring 406 are transferable from the pre-cure chamber 402 to the curing chamber 404. The curing chamber 404 generally comprises a chamber body 432 having an interior volume 440. The pedestal 410 is disposed on a rack 420 in the interior volume 440 during curing. The ring 406 may be disposed along an outer periphery of the substrate 212 and configured to curve an outer edge 442 of the substrate 212 towards the pedestal 410 (as shown in FIGS. 5A and 5B). The curing chamber 404 includes a heat source configured to heat the substrate to a temperature of about 100 to about 200 degrees Celsius. In some embodiments, the heat source is configured to deliver hot gas 416 to the interior volume 440. However, any other suitable heat source may be used. In some embodiments, a vacuum source 460 is coupled to the pedestal 410 and configured to vacuum chuck the substrate 212 to the pedestal 410 via the vacuum channels 418, or vacuum grooves.

Referring back to FIG. 1, in some embodiments, the curing chamber is a microwave chamber (e.g., microwave curing chamber 600) and curing the substrate comprises placing the substrate on a pedestal (e.g., pedestal 610) in the microwave chamber and directing microwave energy at the substrate to heat the substrate. The inventors have observed that microwave heating allows for curing to be achieved at a lower temperature than curing in a furnace, leading to less expected warpage of the substrate 212. In some embodiments, the substrate is heated to about 145 to about 165 degrees Celsius in the microwave chamber to cure the substrate. In some embodiments, a temperature of the substrate is measured during curing to control an amount of heat from the heat source.

FIG. 6 depicts a schematic side view of a curing chamber 400 comprising a microwave curing chamber 600 in accordance with at least some embodiments of the present disclosure. The microwave curing chamber 600 generally comprises a chamber body 604 having an interior volume 612. In some embodiments, the heat source is a microwave source 602 is coupled to the chamber body 604 and configured to provide microwave energy into the interior volume 612 to heat the substrate 212. A pedestal 610 is disposed in the interior volume 612. In some embodiments, the pedestal 610 is made of a material substantially transparent to microwave radiation. In some embodiments, the pedestal 610 is made of quartz.

In some embodiments, a center plate 606 is disposed on the pedestal 610 and between the pedestal 610 and the central region 422 of the substrate 212. The center plate 606 may act as a fulcrum for stresses applied to the substrate 212 and elevates the central region 422 of the substrate with respect to an outer edge of the substrate. In some embodiments, the center plate 606 is a substantially flat disk. In some embodiments, the center plate 606 has a curved upper surface 624. In some embodiments, the center plate 606 is made of a same material or similar material as the material of the pedestal 610. In some embodiments, the center plate 606 is made of glass. The ring 406 may be placed on the peripheral region 424 of the substrate 212 to induce curvature. In some embodiments, inducing the curvature on the substrate further comprises placing one or more weights 412 on the ring to provide additional force on the outer edge of the substrate. The ring 406 and one or more weights 412 may be made of a same material or similar material as the material of the pedestal 610. For example, the ring 406 may be made of quartz.

In some embodiments, the curing chamber 400 includes a temperature sensor 620 configured to measure a temperature of the substrate 212. The temperature sensor 620 may be disposed in the interior volume 612, as shown in FIG. 6, or embedded in the chamber body 604 or disposed outside of the chamber body 604.

While the foregoing is directed to embodiments of the present disclosure, other and further embodiments of the disclosure may be devised without departing from the basic scope thereof.

The invention claimed is:

1. A method for reducing warpage of a substrate, comprising:
applying an epoxy mold over a plurality of dies on the substrate in a dispenser tool;
placing the substrate on a pedestal in a curing chamber, wherein the pedestal has a central region that is raised with respect to a peripheral region of the pedestal, and wherein the substrate has an expected post-cure deflection in a first direction;
inducing a curvature on the substrate in a direction opposite the first direction applying a force against the substrate to conform the substrate to the pedestal, wherein applying the force comprises placing a ring that is weighted on an outer about 1 to about 3 mm of the substrate; and curing the substrate by heating the substrate in the curing chamber.

2. The method of claim 1, wherein curing the substrate comprises:

precuring the substrate in a precure chamber by placing the pedestal and the substrate on a heater plate;

subsequently moving the pedestal and the substrate to a furnace; and heating the substrate in the furnace.

3. The method of claim 2, wherein at least one of:

during curing, the furnace is heated to a temperature of about 165 to about 190 degrees Celsius; or during precuring, the substrate is heated to about 105 to about 125 degrees Celsius.

4. The method of claim 1, wherein inducing the curvature on the substrate comprises elevating a central region of the substrate about 1 to about 3 mm with respect to an outer edge of the substrate.

5. The method of claim 1, further comprising measuring a temperature of the substrate during curing.

6. The method of claim 1, wherein inducing the curvature further comprises vacuum chucking the substrate to the pedestal.

7. The method of claim 1, wherein inducing the curvature further comprises placing a center plate on the pedestal, and placing the substrate on the center plate.

8. The method of claim 1, wherein the curing chamber is a microwave chamber and curing the substrate comprises:

placing the substrate on the pedestal in the microwave chamber; and directing microwave energy at the substrate to heat the substrate.

9. The method of claim 8, wherein the substrate is heated to about 145 to about 165 degrees Celsius in the microwave chamber to cure the substrate.

10. The method of claim 1, wherein heating the substrate in the curing chamber is performed for a duration of about 1 to about 2 hours.

11. A method for reducing warpage of a substrate, comprising:

applying an epoxy mold over a plurality of dies on the substrate in a dispenser tool;

placing the substrate on a center plate that is disposed on pedestal in a curing chamber, wherein the center plate acts as a fulcrum, and wherein the substrate has an expected post-cure deflection in a first direction;

inducing a curvature on the substrate so that the central region of the substrate is elevated about 1 to about 3 mm with respect to the outer edge of the substrate; and curing the substrate by heating the substrate in the curing chamber.

12. The method of claim 11, wherein the curing chamber is a microwave chamber, and the pedestal is made of quartz.

13. The method of claim 11, wherein inducing the curvature on the substrate comprises:

placing a ring along the outer edge of the substrate to curve the outer edge towards the pedestal.

14. The method of claim 13, further comprising placing one or more weights on the ring to provide additional force on the outer edge of the substrate.

15. A curing chamber for reducing warpage of a substrate with an epoxy layer, comprising:

a chamber body having an interior volume;

a pedestal that is transferable and that supports the substrate disposed in the interior volume, wherein the pedestal is configured to induce a curvature on the substrate;

a ring disposed along an outer periphery of the substrate and configured to curve an outer edge of the substrate towards the pedestal, wherein the ring is entirely disposed above the pedestal; and a heat source configured to heat the substrate to a temperature of about 100 to about 200 degrees Celsius.

16. The curing chamber of claim 15, further comprising a vacuum source coupled to the pedestal and configured to vacuum chuck the substrate to the pedestal.

17. The curing chamber of claim 15, wherein the heat source comprises a microwave source, wherein the pedestal is made of quartz, and wherein the ring is made of quartz.

18. The curing chamber of claim 17, further comprising a glass plate disposed between the substrate and the pedestal at a central region of the substrate to elevate the central region with respect to the outer edge of the substrate.

19. The curing chamber of claim 15, wherein the curing chamber is a furnace and the heat source is configured to direct hot gas to the interior volume.

20. The curing chamber of claim 15, further comprising one or more weights disposed on the ring to provide additional force on the outer edge of the substrate.

* * * * *

UNITED STATES PATENT AND TRADEMARK OFFICE
CERTIFICATE OF CORRECTION

PATENT NO. : 11,929,260 B2
APPLICATION NO. : 17/410958
DATED : March 12, 2024
INVENTOR(S) : Fang Jie Lim et al.

Page 1 of 1

It is certified that error appears in the above-identified patent and that said Letters Patent is hereby corrected as shown below:

In the Claims

Column 6, Line 67, Claim 1, after "opposite the first direction" insert -- by --

Signed and Sealed this
Seventeenth Day of December, 2024

Derrick Brent
*Acting Director of the United States Patent and Trademark Office*